United States Patent
Ma

(10) Patent No.: US 9,172,244 B1
(45) Date of Patent: *Oct. 27, 2015

(54) SELF BIASED ELECTRO-STATIC DISCHARGE CLAMP (ESD) FOR POWER RAIL

(71) Applicant: Taiwan Semiconductor Manufacturing Co., Ltd., Hsin-Chu (TW)

(72) Inventor: Wei Yu Ma, Taitung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/291,020

(22) Filed: May 30, 2014

Related U.S. Application Data

(63) Continuation-in-part of application No. 13/415,621, filed on Mar. 8, 2012.

(51) Int. Cl.
| | | |
|---|---|---|
| H01L 27/02 | (2006.01) | |
| H01L 23/60 | (2006.01) | |
| H01L 21/8234 | (2006.01) | |
| H02H 9/04 | (2006.01) | |
| H01L 27/06 | (2006.01) | |

(52) U.S. Cl.
CPC ........... *H02H 9/046* (2013.01); *H01L 21/8234* (2013.01); *H01L 27/0248* (2013.01); *H01L 27/0266* (2013.01); *H01L 27/0629* (2013.01)

(58) Field of Classification Search
CPC ............ H01L 27/0248; H01L 27/0251; H01L 27/0255; H01L 27/0266; H01L 27/0281; H01L 27/0285; H01L 27/0288; H01L 27/0292; H01L 27/0296; H01L 27/0629; H01L 21/8234; H01L 21/823406; H01L 23/60; H02H 9/04; H02H 9/045–9/046

See application file for complete search history.

(56) References Cited

U.S. PATENT DOCUMENTS

| | | | |
|---|---|---|---|
| 6,144,542 A  * | 11/2000 | Ker et al. ....................... | 361/111 |
| 6,582,997 B1 * | 6/2003 | Lee et al. ...................... | 438/208 |
| 7,102,862 B1 | 9/2006 | Lien et al. | |
| 7,203,045 B2 | 4/2007 | Chatty et al. | |
| 7,221,551 B2 | 5/2007 | Chen | |
| 7,408,752 B2 | 8/2008 | Ma et al. | |
| 7,692,907 B2 * | 4/2010 | Chen et al. ...................... | 361/56 |
| 7,982,523 B2 * | 7/2011 | Russ ............................. | 327/313 |
| 8,179,647 B2 * | 5/2012 | Chu et al. ......................... | 361/56 |
| 8,331,068 B2 * | 12/2012 | Lee et al. ......................... | 361/56 |
| 8,363,368 B2 * | 1/2013 | Poulton .......................... | 361/56 |
| 8,760,828 B2 * | 6/2014 | Ma ................................. | 361/56 |
| 8,867,183 B2 * | 10/2014 | Chen et al. ...................... | 361/56 |
| 9,035,393 B2 * | 5/2015 | Ma et al. ........................ | 257/379 |

(Continued)

*Primary Examiner* — William F Kraig
*Assistant Examiner* — Maliheh Malek
(74) *Attorney, Agent, or Firm* — Duane Morris LLP

(57) ABSTRACT

A circuit with an electro-static discharge clamp coupled to a first power source and second power source. The electro-static discharge clamp includes an NMOS stack and an electro-static discharge detector. The NMOS stack has a first NMOS transistor with a first gate node and a second NMOS transistor with a second gate node. The electro-static discharge detector is configured to control the NMOS stack, and may include three switches. A first switch is configured to switch the first gate node to the second power source. A second switch is configured to switch the first gate node to the second gate node. A third switch is configured to switch the first gate node to the ground.

20 Claims, 14 Drawing Sheets

(56) References Cited

U.S. PATENT DOCUMENTS

| | | |
|---|---|---|
| 2005/0040466 A1 | 2/2005 | Arai et al. |
| 2005/0219782 A1* | 10/2005 | Chen .................... 361/91.1 |
| 2007/0085144 A1* | 4/2007 | Chen .................... 257/362 |
| 2007/0103825 A1* | 5/2007 | Ker et al. ............... 361/56 |
| 2007/0183104 A1* | 8/2007 | Tseng .................... 361/56 |
| 2010/0232078 A1* | 9/2010 | Bhattacharya et al. ... 361/56 |
| 2011/0195744 A1* | 8/2011 | Zhang .................... 455/550.1 |
| 2011/0235228 A1* | 9/2011 | Salcedo et al. ........... 361/111 |
| 2011/0255200 A1* | 10/2011 | Tsai et al. ............... 361/56 |
| 2012/0081820 A1* | 4/2012 | Chu et al. ............... 361/56 |
| 2012/0176720 A1* | 7/2012 | Tsai ...................... 361/220 |
| 2013/0016445 A1* | 1/2013 | Liu et al. ................ 361/56 |
| 2013/0027820 A1* | 1/2013 | Padilla et al. ........... 361/56 |
| 2013/0170080 A1* | 7/2013 | Chen ..................... 361/56 |
| 2013/0335099 A1* | 12/2013 | Di Sarro et al. ......... 324/537 |
| 2014/0029142 A1* | 1/2014 | Ma et al. ................ 361/56 |
| 2015/0043113 A1* | 2/2015 | Yang et al. .............. 361/56 |
| 2015/0077886 A1* | 3/2015 | Chen et al. .............. 361/56 |

\* cited by examiner

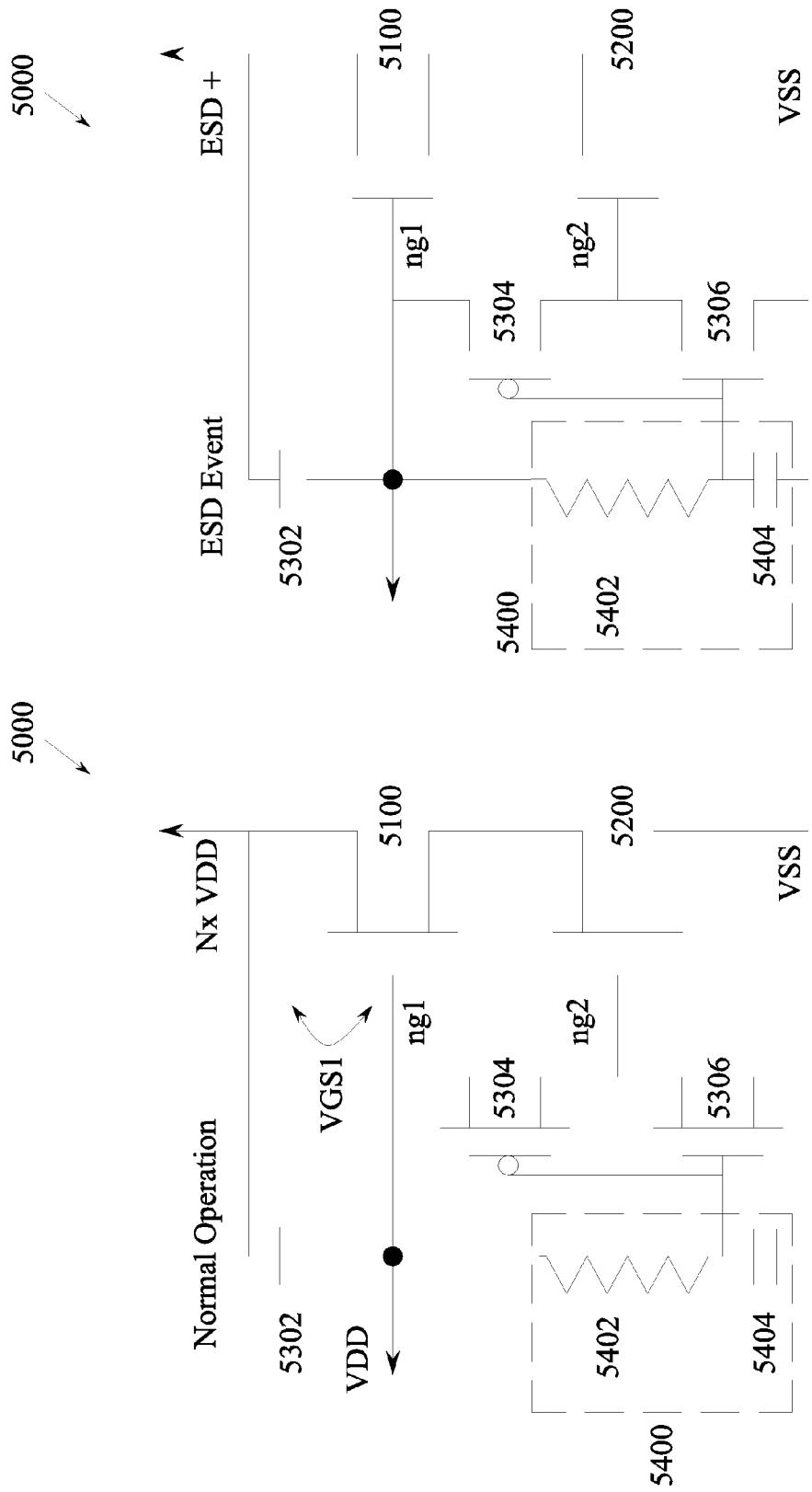

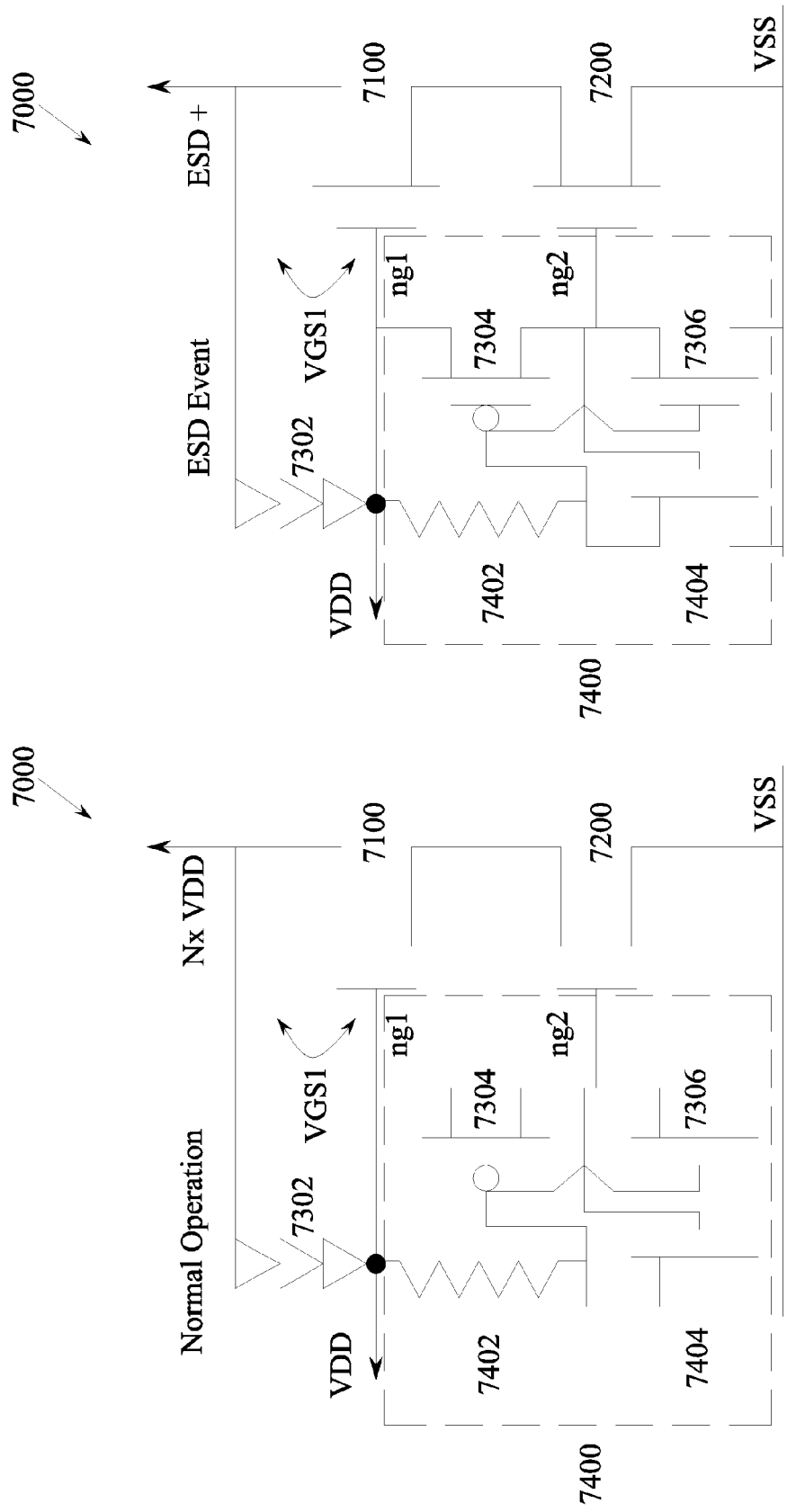

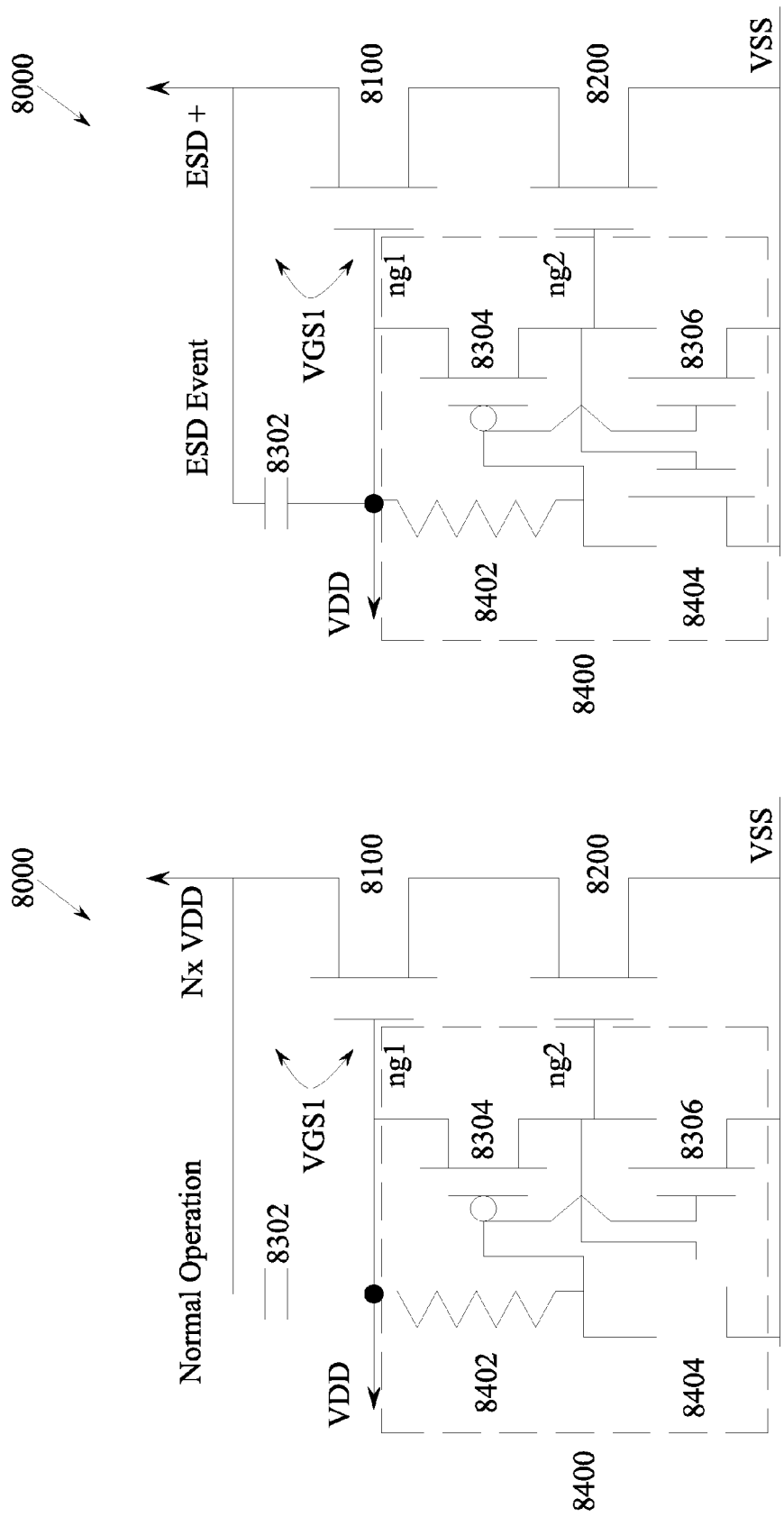

SELF BIASED ELECTRO-STATIC DISCHARGE CLAMP (ESD) FOR POWER RAIL

PRIORITY CLAIM AND CROSS-REFERENCE

This application is a continuation-in-part and claims the benefit of U.S. patent application Ser. No. 13/415,621, filed Mar. 8, 2012, and entitled "Electro-static discharge clamp (ESD) for NxVDD power rail," and is hereby incorporated herein by reference.

BACKGROUND

1. Technical Field

Aspects of the present disclosure relate in general to electronic circuitry. In particular, aspects of the disclosure include an electro-static discharge (ESD) clamp designed to be used with a high-power VDD rail in a single gate complementary metal oxide semiconductor (CMOS) circuit.

2. Description of the Related Art

Connections to integrated circuit (IC) inputs, outputs, and power are susceptible to electro-static discharge events that can damage internal components. An ESD event is a short discharge of electric energy caused by the sudden release of an electro-static build-up of electrical charge. If electro-static discharge-induced currents flow suddenly and strongly through electronic components, the high currents can literally melt the carefully formed layers of an integrated circuit. A chip is particularly susceptible to electro-static discharge when it is not mounted into a larger circuit (e.g., mounted onto a printed circuit board). Electro-static discharge protection is therefore particularly important in maintaining the reliability of semiconductor products, and commercial integrated circuits are generally expected to sustain without damage an electro-static discharge event in excess of 2,000 volts, which is often denoted as the human-body-model ESD voltage.

Semiconductor devices are becoming increasingly complex, and at the same time the devices' circuitry is becoming smaller and more crowded on the devices to accommodate the new and complex functions. The decreased size and spacing of the Reliability in semiconductor circuits is an important aspect of chip design. With the increasing complexity of CMOS circuits and the increased density of the silicon on which the circuits reside, the power-supply voltage for such circuits are reduced for low-power applications. At the same time, the thickness of gate oxide is often scaled down to increase circuit operating speed. However, this scaling increases the number of semiconductor processing steps.

Another issue with thinner gate-oxides is that the gate-oxide may become overstressed.

In a conventional power supply clamp circuit 1000 is shown in FIG. 1. The circuit 1000 may include a high-performance IC 110 or high-voltage circuit 120, and an active ESD clamp 100. ESD clamp 100 works during ESD events to provide a current path from the input pad 130A-B or power supply VDD to the substrate bias voltage supply, VSS, which is normally ground, or to another circuit element that is equipped to absorb the ESD current. In a conventional power supply clamp circuit, the power supply line is routed to ground through a clamp transistors that is biased to be "off" during normal circuit operation. When a voltage in excess of the maximum allowed voltage on a power supply line is detected by the ESD protection circuit, the clamp transistor will turn "on," thereby shunting the induced ESD potential to ground.

SUMMARY

Embodiments include a circuit with an electro-static discharge clamp coupled to a first power source and second power source. The electro-static discharge clamp includes an NMOS stack and an electro-static discharge detector. The NMOS stack has a first NMOS transistor with gate node ng1 and a second NMOS transistor with gate node ng2. The electro-static discharge detector is configured to control the NMOS stack, and may include three switches. A first switch is configured to switch the gate node ng1 to the second power source. A second switch is configured to switch the gate node ng1 to the gate node ng2. A third switch is configured to switch the gate node ng1 to the ground. During normal operation of the circuit, the first switch is open, the second switch is open, and the third switch is closed. During an electronic discharge event, the first switch is closed, the second switch is closed, and the third switch is open. An electro-static discharge sensor may be configured to control the second switch and the third switch. In some embodiments, the electro-static discharge sensor may be a resistance-capacitance (RC) inverter, or a latch circuit detector. In some embodiments, the first switch may be a capacitor or a diode string. In yet other embodiments, the second switch may be a PMOS transistor. In another embodiment, the third switch may be a third NMOS transistor.

Embodiments also include a method of operating an electro-static discharge clamp coupled to a first power source and second power source during an electronic discharge event. The method includes shorting a first switch configured to switch a gate node ng1 of a first NMOS transistor to the second power source shorting a second switch configured to switch the gate node ng1 to the gate node ng2 of a second NMOS transistor, and opening a third switch configured to switch the gate node ng2 to the ground. The first NMOS transistor has a drain connected to the second power source. The second NMOS transistor being stacked with the first NMOS transistor and having a source connected to ground.

DESCRIPTION OF THE DRAWINGS

FIGS. 5A and 5B illustrate an alternate embodiment of an electro-static discharge clamp with a capacitance and a resistor-capacitor (RC)-based detector to detect electro-static discharge in normal operation and during an electro-static discharge event.

FIGS. 7A and 7B illustrate an alternate embodiment of electro-static discharge clamp with a diode string and a latch circuit detector to detect electro-static discharge in normal operation and during an electro-static discharge event.

FIGS. 8A and 8B illustrate an alternate embodiment of electro-static discharge clamp with a capacitance and a latch circuit detector to detect electro-static discharge in normal operation and during an electro-static discharge event.

DETAILED DESCRIPTION

Figure 1:
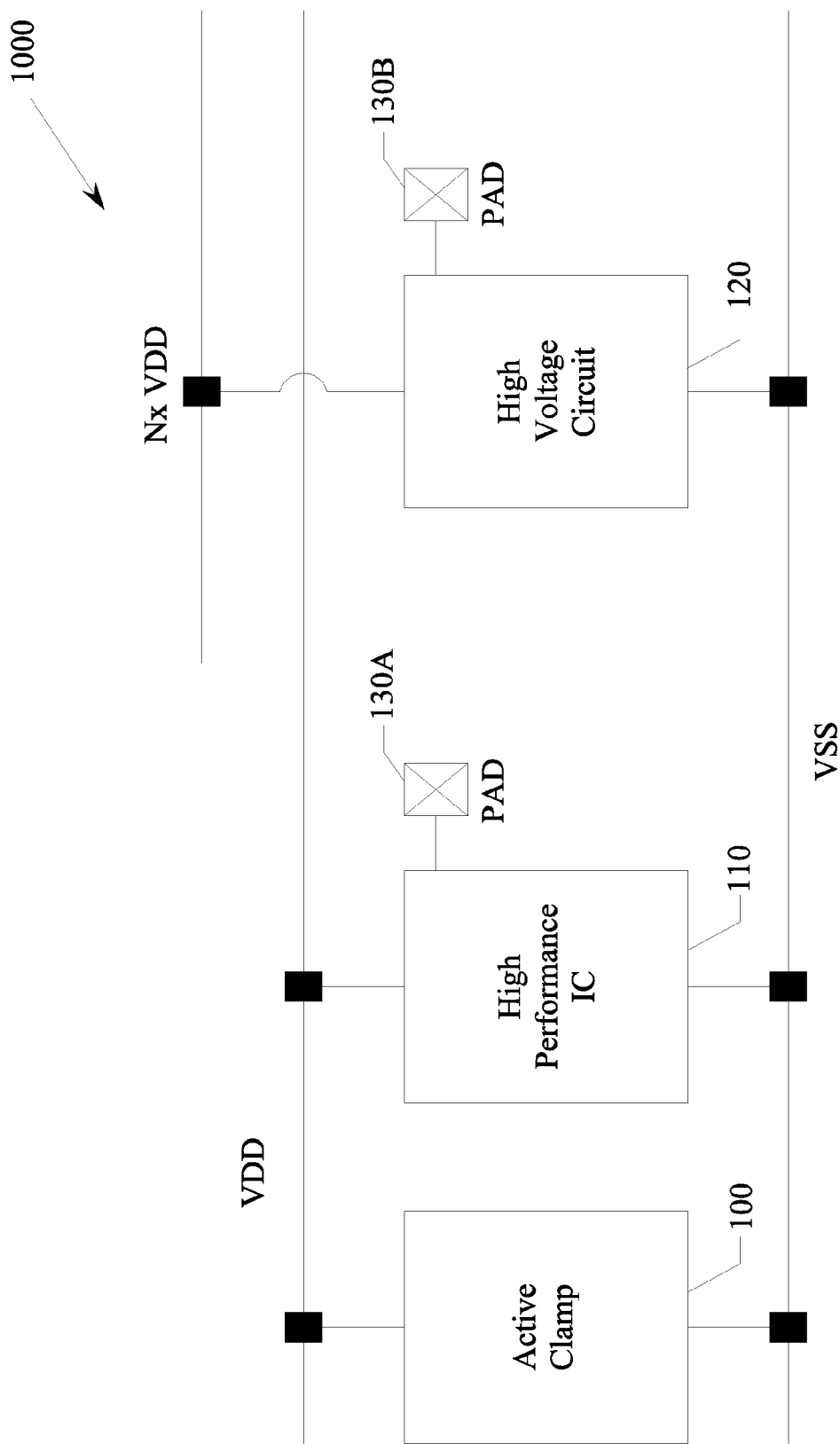
FIG. 1 depicts a conventional circuit structure using an active electro-static discharge clamp of the PRIOR ART.

One aspect of the present disclosure includes an electro-static discharge clamp designed to be used with a high-power VDD rail in a single gate complementary metal oxide semiconductor circuit.

In another aspect, an n-channel metal oxide semiconductor (NMOS) transistor stack is used to discharge an ESD current. A detector is used to control the NMOS gate oxide stack. Electro-static discharge detection may be performed in a variety of different ways without deviating from the spirit of the disclosure.

Embodiments overcome the gate oxide reliability issue. This results in a more reliable circuit.

The following embodiments are described in a plurality of sections. Further, circuit elements making up each of functional blocks of the following embodiments are formed on a semiconductor substrate made of a single crystal silicon by use of the known integrated circuit (integrated circuit) technology for complementary metal oxide semiconductors transistors. With the present embodiments, a MOSFET (Metal Oxide Semiconductor Field Effect Transistor) (abbreviated to MOS transistor) is used as an example of a Metal Insulator Semiconductor Field Effect Transistor (MISFET). However, a non-oxide film is not precluded as a gate insulating film. In the drawings, a symbol 0 is affixed to a p-channel MOS transistor (PMOS transistor or "p-type" transistor) to be thereby differentiated from an n-channel MOS transistor (NMOS transistor or "n-type" transistor). Further, in the drawings, connection of a substrate potential of a MOS transistor is not specifically shown, however, there is no particular limitation to a connection method thereof if the MOS transistor is present in a normally operable range.

Embodiments of the invention will be described hereinafter with reference to the drawings. In all the drawings for use describing the embodiments, identical members are in principle denoted by like reference numerals, thereby omitting detailed description thereof.

Figure 2:
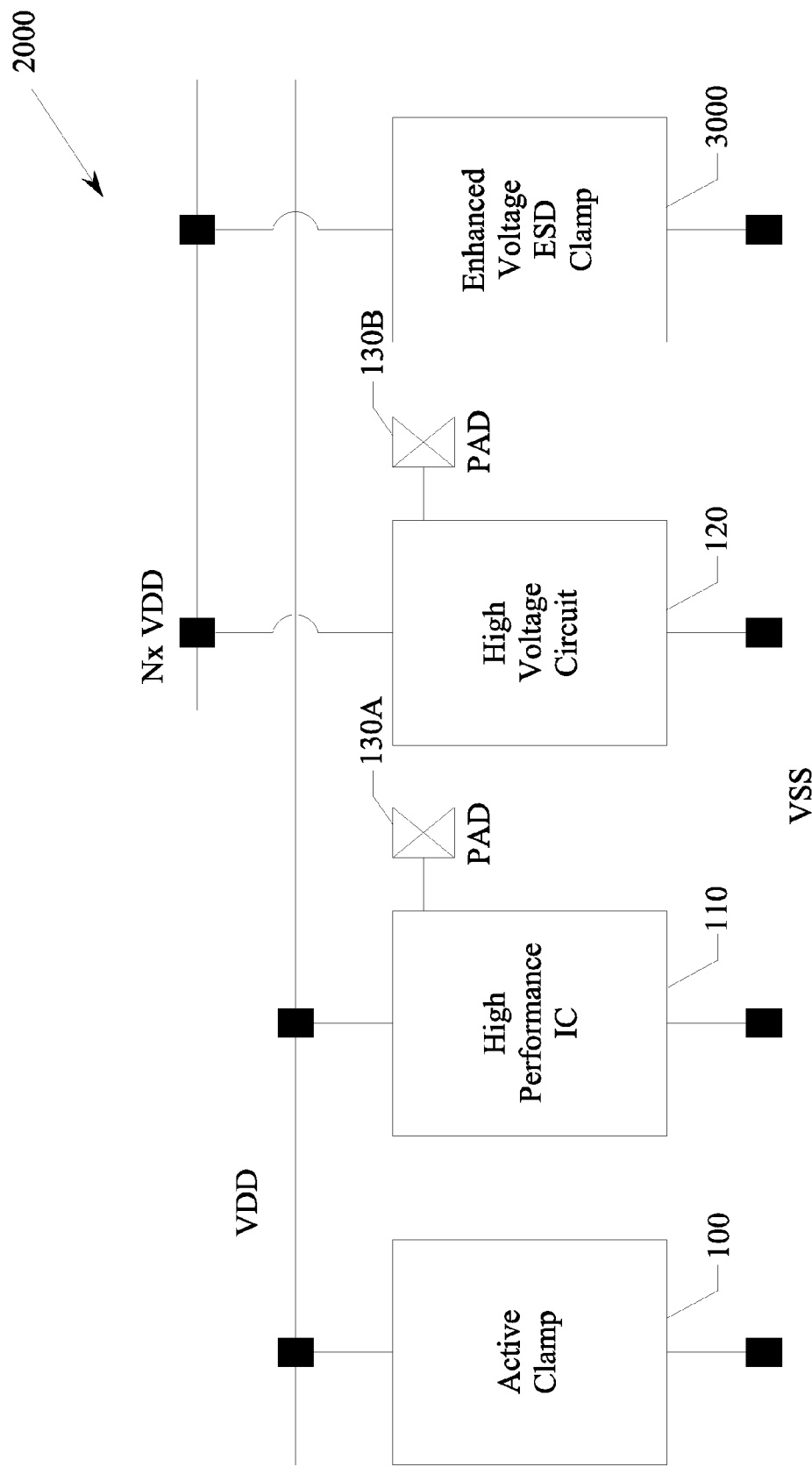
FIG. 2 illustrates a circuit using an embodiment of electro-static discharge clamp for use with a high-power VDD rail in a single gate complementary metal oxide semiconductor circuit.

Turning to an embodiment of a circuit 2000 with an high voltage electro-static discharge clamp 3000, shown in FIG. 2. FIG. 2 illustrates an embodiment of a electro-static discharge clamp 3000, constructed and operative in accordance with an embodiment of the current disclosure. As shown in FIG. 2, circuit 2000 may comprise an enhanced (or high) voltage ESD clamp 3000 for use with a high voltage circuit 120, a high performance integrated circuit 110. High performance integrated circuit 110 and high voltage circuit 120 may each be connected to a contact pad 130A-B. In addition, an active clamp 100 may also be used.

Figure 3:
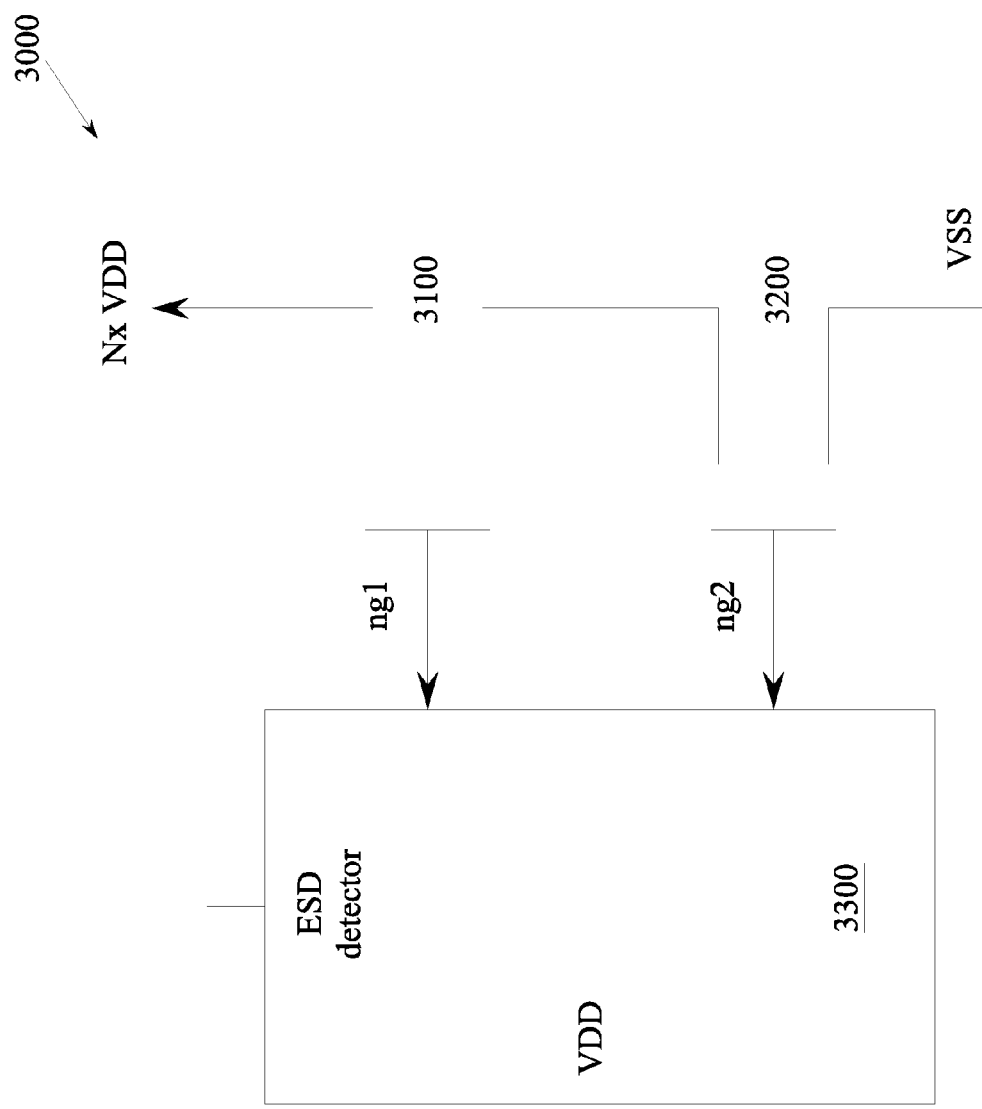
FIG. 3 is an embodiment of an electro-static discharge clamp for use with a high-power VDD rail.

Moving to FIG. 3, electro-static discharge clamp 3000 for use with a high-power (NxVDD) rail is illustrated, constructed and operative in accordance with an embodiment of the current disclosure. As shown, electro-static discharge clamp 3000 comprises two stacked NMOS transistors 3100, 3200 with gates ng1 and ng2 each coupled to an electro-static discharge detector circuit 3300. The drain of NMOS transistor 3100 is connected to the high power (second) power source, while the source of NMOS transistor 3200 is connected to ground. ESD detector 3300 controls the NMOS transistor stack 3100, 3200 without a gate oxide reliability issue. Embodiments and depicting details and operation of ESD detector 3300 are described below.

Figure 4A:
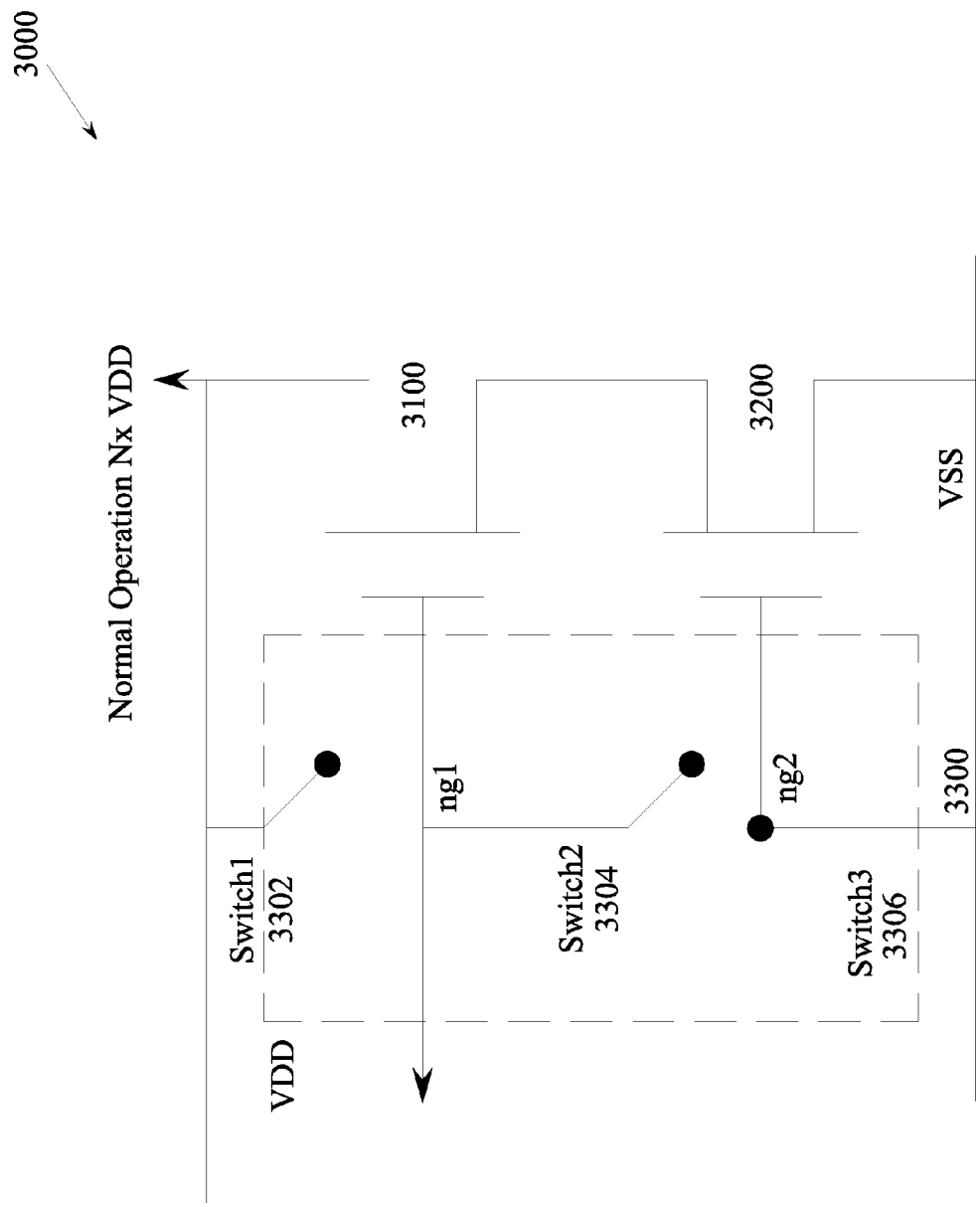
FIGS. 4A and 4B depict an embodiment of an electro-static discharge clamp for use with a high-power VDD rail in normal operation and during an electro-static discharge event.
Figure 4B:
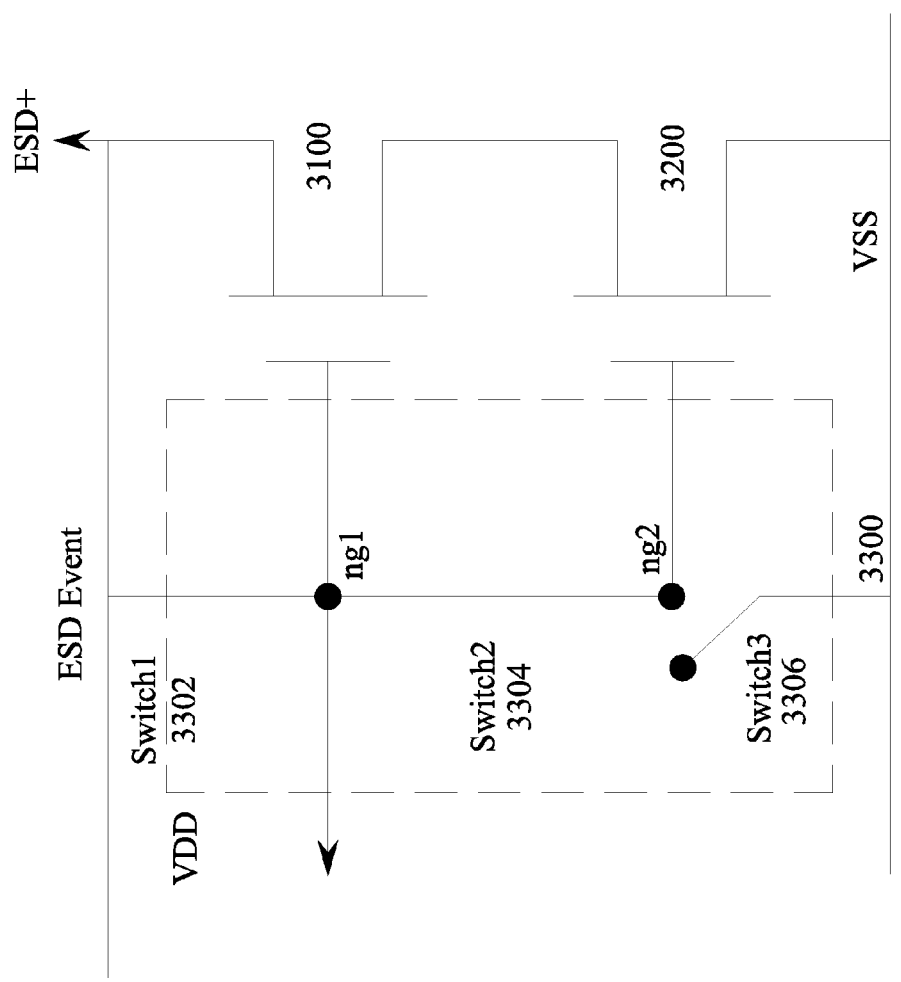

FIGS. 4A and 4B depict an embodiment of an electro-static discharge clamp for use with a high-power VDD rail in normal operation and during an electro-static discharge event, constructed and operative in accordance with an embodiment of the current disclosure. FIG. 4A shows a normal operation of electro-static discharge clamp 3000, while FIG. 4B illustrates an electro-static discharge operation of the ESD clamp 3000. As shown in both figures FIG. 4A and FIG. 4B, electro-static discharge detector circuit 3300 comprises switch 1 3302, switch 2 3304, and switch 3 3306. The three switches 3302-3306 may be implemented in any way known in the art. Switch 1 3302 may couple node ng1 with NxVDD; switch 2 3304 may couple node ng1 with node ng2, while switch 3 3306 may couple node ng2 with VSS (ground).

In normal operation, shown in FIG. 4A, switch 1 3302 is open, which ties node ng1 with VDD. Meanwhile node ng2 is connected to VSS (ground), and switch 2 3304 is open, and switch 3 3306 connects node ng2 to ground.

When an electro-static discharge event occurs, shown in FIG. 4B, switch 1 3302 connects node ng1 to ESD+. Meanwhile node ng2 connected to ESD+, and switch 2 3304 connects node 2 to ng1 to ESD+, and switch 3 3306 connects node ng2 is open.

In these embodiments, switch 1 may be implemented as a capacitance or diode string. Switch 2 may be a PMOS transistor, and switch 3 may be an NMOS transistor. In such embodiments, switch 2 and switch 3 may be controlled using a resistance-capacitance (RC) inverter, or a latch circuit. Embodiments will be shown both in normal operation and during an electro-static discharge event.

FIGS. 5A and 5B illustrate an alternate embodiment of an electro-static discharge clamp with a capacitance and a resistor-capacitor (RC)-based sensor to detect electro-static discharge in normal operation and during an electro-static discharge event, constructed and operative in accordance with an embodiment of the current disclosure.

FIG. 5A depicts an embodiment in which electro-static discharge clamp 5000 comprises two stacked NMOS transistors 5100, 5200 with gates at nodes ng1 and ng2 each coupled to an electro-static discharge detector circuit with three switches. In this embodiment, switch 1 5302 is a capacitance, switch 2 5304 is a PMOS transistor, and switch 3 is another NMOS transistor 5306. The capacitor 5302 acts to sense an electro-static discharge signal for node ng1. Furthermore, switch 2 and switch 3 may be controlled using a resistance-capacitance (RC) 5400, comprising resistor 5402 and capacitor 5404.

During an electro-static discharge event, as shown in FIG. 5B, the capacitor (switch 1) 5302 couples node ng1 with ESD+. An electro-static discharge sensor 5400, in this example resistance-capacitance (RC) 5400, senses the electro-static discharge event and connects node ng2 with ESD+ (turning switch 2 5304 on), and switches switch 3 5306 off.

Figures 6A, 6B:
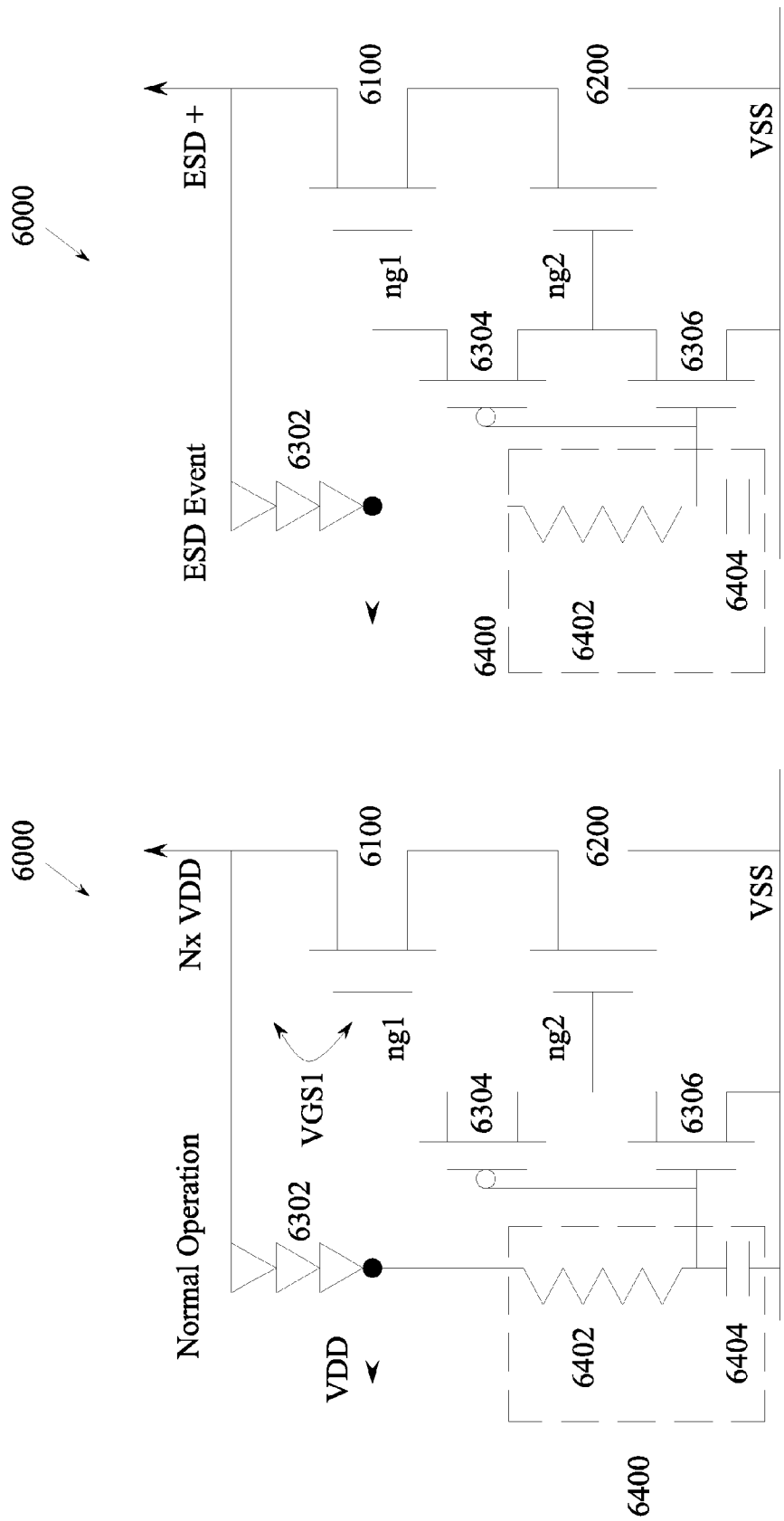
FIGS. 6A and 6B show another alternate embodiment of an electro-static discharge clamp with a diode string and a resistor-capacitor (RC)-based detector to detect electro-static discharge in normal operation and during an electro-static discharge event.

FIGS. 6A and 6B illustrate another alternate embodiment of an electro-static discharge clamp with a diode string and a resistor-capacitor (RC)-based sensor to detect electro-static discharge in normal operation and during an electro-static discharge event, constructed and operative in accordance with an embodiment of the current disclosure.

As shown in FIG. 6A, an embodiment in which electro-static discharge clamp 6000 comprises two stacked NMOS transistors 6100, 6200 with gates at nodes ng1 and ng2 each coupled to an electro-static discharge detector circuit with three switches. In this embodiment, switch 1 6302 is a diode string 6302, switch 2 is 6304 is a PMOS transistor, and switch 3 is another NMOS transistor 6306. The diode string 6302 acts to sense an electro-static discharge signal for node ng1. Furthermore, switch 2 and switch 3 may be controlled using a resistance-capacitance (RC) inverter 6400, comprising resistor 6402 and capacitor 6404.

During an electro-static discharge event, as illustrated in FIG. 6B, the diode string (switch 1) 6302 connects node ng1 with ESD+. An electro-static discharge sensor 6400, in this example a resistance-capacitance (RC) inverter 6400, senses the electro-static discharge event and couples node ng2 with ESD+(turning switch 2 6304 on), and switches switch 3 6306 off.

FIGS. 7A and 7B illustrate an alternate embodiment of electro-static discharge clamp with a diode string and a latch circuit detector to detect electro-static discharge in normal operation and during an electro-static discharge event, constructed and operative in accordance with an embodiment of the current disclosure.

FIG. 7A depicts an embodiment in which electro-static discharge clamp 7000 comprises two stacked NMOS transistors 7100, 7200 with gates at nodes ng1 and ng2 each coupled to an electro-static discharge detector circuit with three switches. In this embodiment, switch 1 7302 is a diode string 7302, switch 2 is 7304 is a PMOS transistor, and switch 3 is another NMOS transistor 7306. The capacitor 7302 acts to sense an electro-static discharge signal for node ng1. Furthermore, switch 2 and switch 3 may be controlled using an electro-static discharge sensor 7400, in this figure a latch circuit detector 7400, comprising resistor 7402 and an NMOS transistor 7404.

When an electro-static discharge event occurs, as shown in FIG. 7B, the diode string (switch 1) 7302 connects node ng1 with ESD+. latch circuit detector 7400 senses the electro-static discharge event and couples node ng2 with ESD+(turning switch 2 7304 on), and switches switch 3 7306 off.

FIGS. 8A and 8B illustrate an alternate embodiment of electro-static discharge clamp with a capacitance and a latch circuit detector to detect electro-static discharge in normal operation and during an electro-static discharge event, constructed and operative in accordance with an embodiment of the current disclosure.

FIG. 8A depicts an embodiment in which electro-static discharge clamp 8000 comprises two stacked NMOS transistors 8100, 8200 with gates at nodes ng1 and ng2 each coupled to an electro-static discharge detector circuit with three switches. In this embodiment, switch 1 8302 is a capacitor 8302, switch 2 is 8304 is a PMOS transistor, and switch 3 is another NMOS transistor 8306. The capacitor 8302 acts to sense an electro-static discharge signal for node ng1. Furthermore, switch 2 and switch 3 may be controlled using an electro-static discharge sensor 8400, in this example a latch circuit detector 8400, comprising resistor 8402 and an NMOS transistor 8404.

When an electro-static discharge event occurs, as shown in FIG. 8B, the capacitor (switch 1) 8302 couples node ng1 with ESD+. latch circuit detector 8400 senses the electro-static discharge event and couples node ng2 with ESD+(turning switch 2 8304 on), and switches switch 3 8306 off.

Figures 9A, 9B:
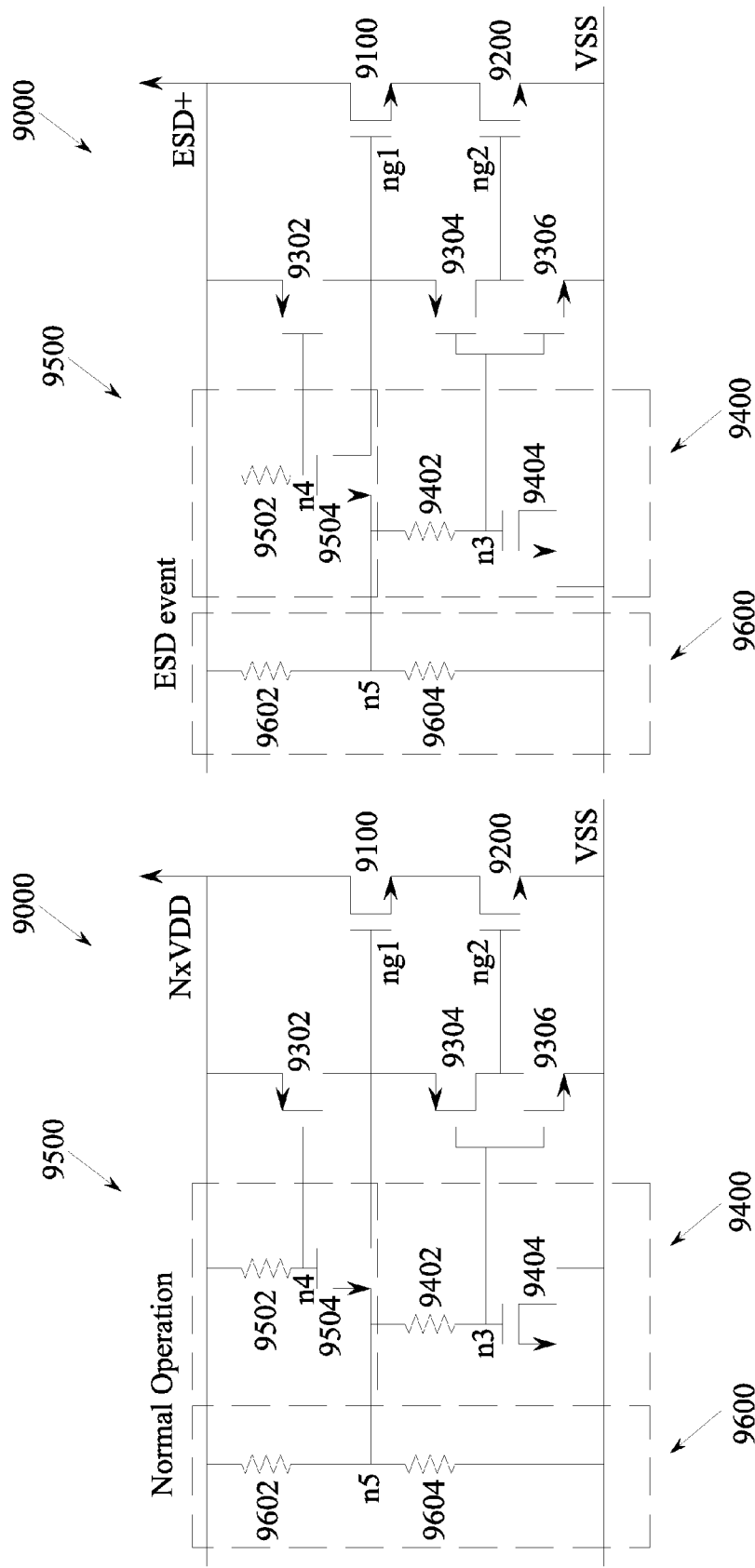
FIGS. 9A and 9B illustrate an alternate embodiment of an electro-static discharge clamp, which further includes a second ESD sensor and a self-bias generator constructed and operative in accordance with some embodiments.

FIGS. 9A and 9B illustrate an alternate embodiment of an electro-static discharge clamp, which, in addition to the sensor depicted in figures above to detect electro-static discharge in normal operation and during an electro-static discharge event, further includes a second ESD sensor 9500 and a self-bias generator 9600 constructed and operative in accordance with an embodiment of the current disclosure.

FIG. 9A depicts an embodiment in which electro-static discharge clamp 9000 comprises two stacked NMOS transistors 9100 and 9200 with gates at nodes ng1 and ng2 each coupled to an electro-static discharge detector circuit with three switches 9302, 9304, and 9306. In this embodiment, switch 9302 is a PMOS transistor, switch 9304 is also a PMOS transistor, and switch 9306 is an NMOS transistor, wherein switch 9304 and switch 9306 form an inverter. The PMOS transistor 9302 acts to sense an electro-static discharge signal for node ng1. In this embodiment, switch 9304 and switch 9306 may be controlled using a resistance-capacitance (RC) ESD sensor 9400, comprising resistor 9402 and capacitor 9404 connected in series with gates of switch 9304 and switch 9306 at node n3. In some embodiments, the capacitor 9404 can be implemented via a NMOS transistor with its gate connected to the gates of 9304 and 9306 and its source and drain connected to VSS.

In the embodiment depicted in FIG. 9A, the electro-static discharge clamp 9000 further comprises a second ESD sensor 9500 configured to control the first stacked NMOS transistor 9100. The second ESD sensor 9500 includes a resistor 9502 coupled between N times of voltage VDD (NxVDD) and the gate of the PMOS transistor 9302 at node n4 and a pass MOS (e.g., NMOS) transistor 9504 serving as a capacitive device having its gate connected to the resistor 9502 and the gate of the PMOS transistor 9302 at node n4, its drain connected directly to gate node ng1 of NMOS transistor 9100, and its source connected to bias point n5 of the self-bias generator 9600. In some embodiments, the resistor 9502 has a large resistance (e.g., greater than 100 k ohm), resulting in long RC response time (e.g., greater than 10 μs).

In the embodiment depicted in FIG. 9A, the electro-static discharge clamp 9000 further comprises a self-bias generator 9600 configured to set (i.e., self-bias) the voltage at node ng1. The self-bias generator 9600 includes two resistors 9602 and 9604 connected in series between NxVDD and VSS where the two resistors 9602 and 9604 connect at the middle bias point n5 used to set the voltage at node ng1. Such built-in middle bias ensures that the proposed ESD clamp can be adopted with only two power terminals (NxVDD and VSS) without requiring any addition circuitry to generate the middle bias.

During normal operation of the electro-static discharge clamp 9000 shown in FIG. 9A, both switch 1 PMOS transistor 9302 and switch PMOS transistor 9304 are open (off), while switch NMOS 9306 is short (on), which connects node ng2 to VSS (ground). As a result, both of the stacked NMOS transistors 9100 and 9200 are open (off). Since switch 1 PMOS transistor 9302 is open, node n4 is connected to NxVDD. As a result, NMOS transistor 9504 is on, connecting node ng1 to the bias point n5, where voltage at node ng1 is controlled and set (self-biased) by the two resistors 9602 and 9604 in the self-bias generator 9600 to a value between NxVDD and VSS (e.g., VDD). The voltage at node n3 is also set to the voltage at n5.

When an electro-static discharge event (ESD+) occurs, as depicted in FIG. 9B, switch 1 PMOS transistor 9302 is on. The second ESD sensor 9500 senses the electro-static discharge event and NMOS transistor 9504 is turned off, connecting node ng1 to ESD+ and blocking node ng1 from the bias point n5. The ESD sensor 9400 also senses the electro-static discharge event and connects node ng2 with ESD+, turning switch 9304 on and switch 9306 off. As a result, both nodes ng1 and ng2 are coupled to ESD+, and both of the stacked NMOS transistors 9100 and 9200 are on to discharge ESD+ to the ground.

Figures 10A, 10B:
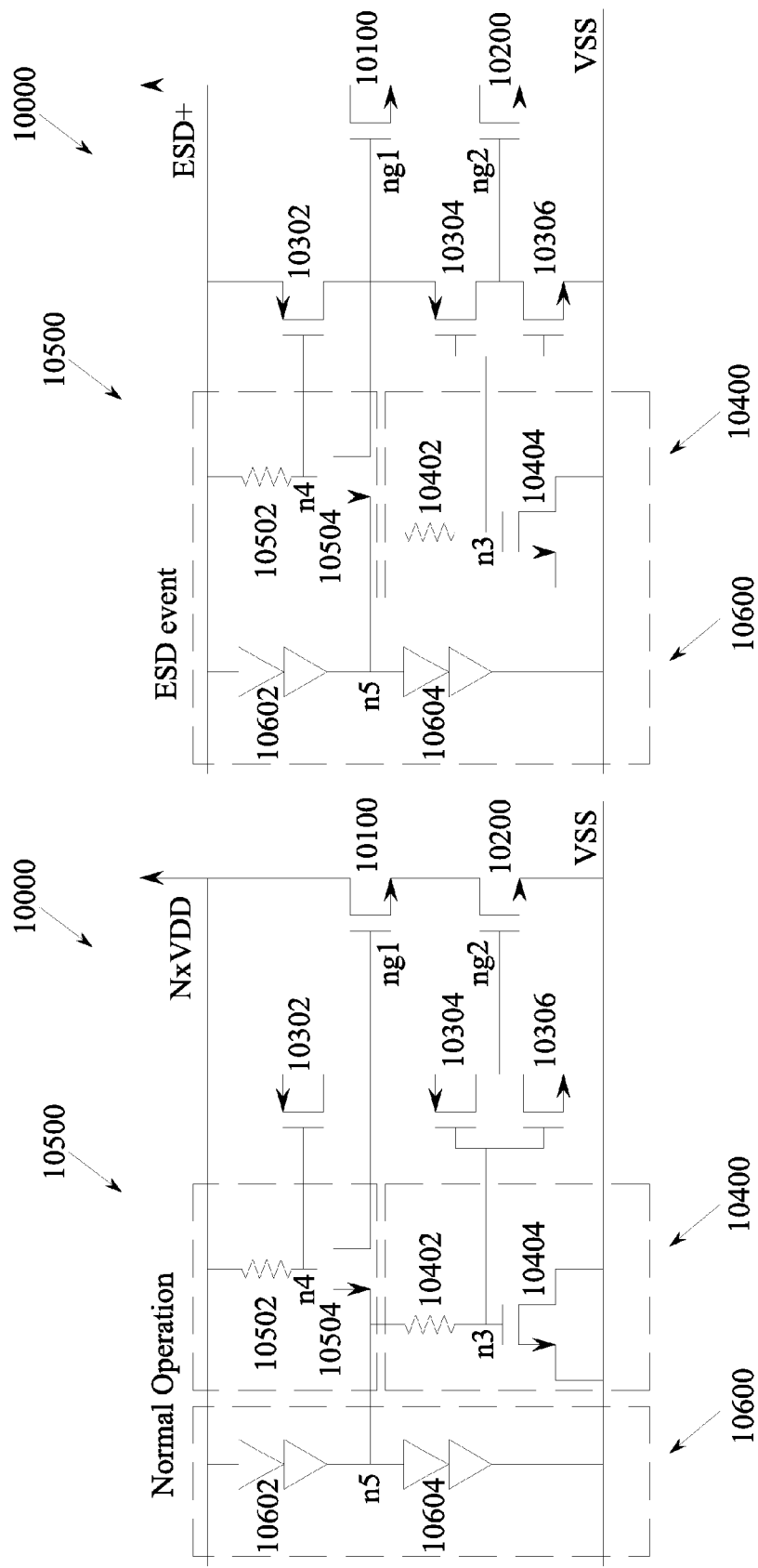
FIGS. 10A and 10B illustrate another alternate embodiment of an electro-static discharge clamp, where at least one or both of the resisters in the self-bias generator depicted in FIGS. 9A and 9B are replaced with one or more diode strings in accordance with some embodiments.

FIGS. 10A and 10B illustrate another alternate embodiment of an electro-static discharge clamp 10000, where at least one or both of the resisters 9602 and 9604 in the self-bias generator 9600 depicted in FIGS. 9A and 9B are replaced with one or more diode strings 10602 and 10604 connected in series between NxVDD and VSS where the two diode strings 10602 and 10604 connect at the bias point n5 used to set the voltage at node ng1. The rest of the electro-static discharge clamp 10000 function in a similar manner as the electro-static discharge clamp 9000 depicted in FIGS. 9A and 9B.

Figures 11A, 11B:
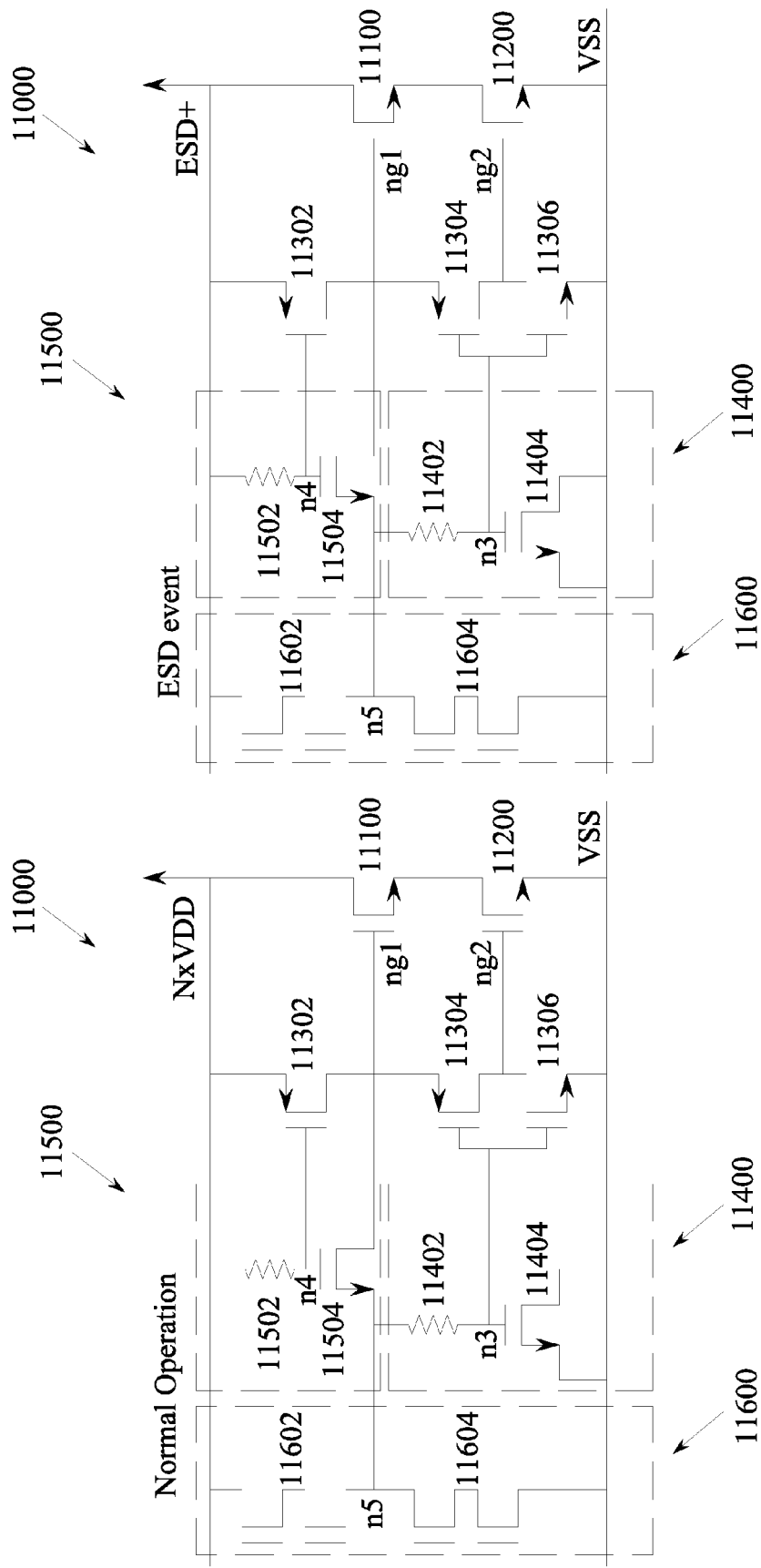
FIGS. 11A and 11B illustrate another alternate embodiment of an electro-static discharge clamp, where at least one or both of the resisters in the self-bias generator depicted in FIGS. 9A and 9B are replaced with one or more MOS transistor strings in accordance with some embodiments.

FIGS. 11A and 11B illustrate another alternate embodiment of an electro-static discharge clamp 11000, where at least one or both of the resisters 9602 and 9604 in the self-bias generator 9600 are replaced with one or more MOS transistor strings 11602 and 11604 connected in series between NxVDD and VSS where the two MOS transistor strings 10602 and 10604 connect at the bias point n5 used to set the voltage at node ng1. The rest of the electro-static discharge clamp 11000 function in a similar manner as the electro-static discharge clamp 9000 depicted in FIGS. 9A and 9B.

Figure 12:
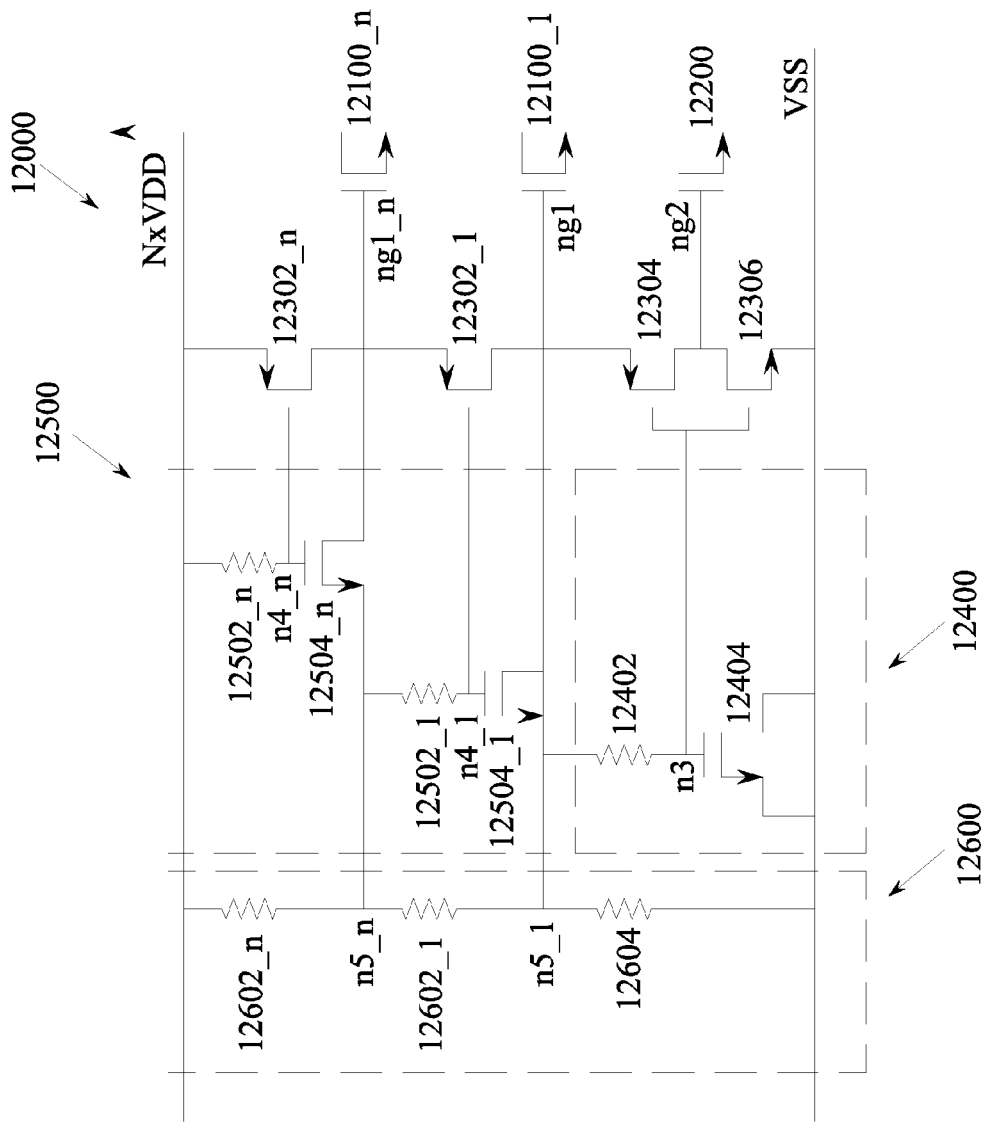
FIG. 12 illustrates another alternate embodiment of an electro-static discharge clamp 12000, which is another version of the electro-static discharge clamp 9000 depicted in FIGS. 9A and 9B in accordance with some embodiments.

FIG. 12 illustrates another alternate embodiment of an electro-static discharge clamp 12000, which is another version of the electro-static discharge clamp 9000 depicted in FIGS. 9A and 9B, wherein the electro-static discharge clamp 12000 comprises a series of more than two stacked NMOS transistors 12100_1 . . . 12100_n and 12200 with gates at nodes ng1_1, . . . , ng1_n and ng2 with corresponding switches. In this embodiment, switches 12302_1, . . . , 12302_n are PMOS transistors, switch 12304 is also a PMOS transistor, and switch 12306 is an NMOS transistor, wherein switch 12304 and switch 12306 form an inverter. The PMOS transistors 12302_1, . . . , 12302_n act to sense an electro-static discharge signal for nodes ng1_1, . . . , ng1_n. As in embodiments discussed above, switch 12304 and switch 12306 may be controlled using a resistance-capacitance (RC) ESD sensor 12400, comprising resistor 12402 and capacitor 12404 implemented via a pass NMOS transistor.

In the embodiment depicted in FIG. 12, the second ESD sensor 12500 in the electro-static discharge clamp 12000 includes a plurality of resistor 12502 and pass MOS (e.g., NMOS) transistor 12504 pair, wherein each pair is configured to control one of the stacked NMOS transistors 12100_1, . . . 12100_n and is connected to one of bias points n5_1, . . . , n5_n of the self-bias generator 12600. The self-bias generator 12600 includes more than two resistors 12602_1, . . . , 12602_n, and 9604 connected in series between NxVDD and VSS where the resistors connect at the middle bias points n5_1, . . . , n5 used to set the voltage at nodes ng1_1, . . . , ng1_n, respectively. The electro-static discharge clamp 12000 functions in a similar manner as the electro-static discharge clamp 9000 depicted in FIGS. 9A and 9B during normal operation and an electro-static discharge event.

Figure 13:
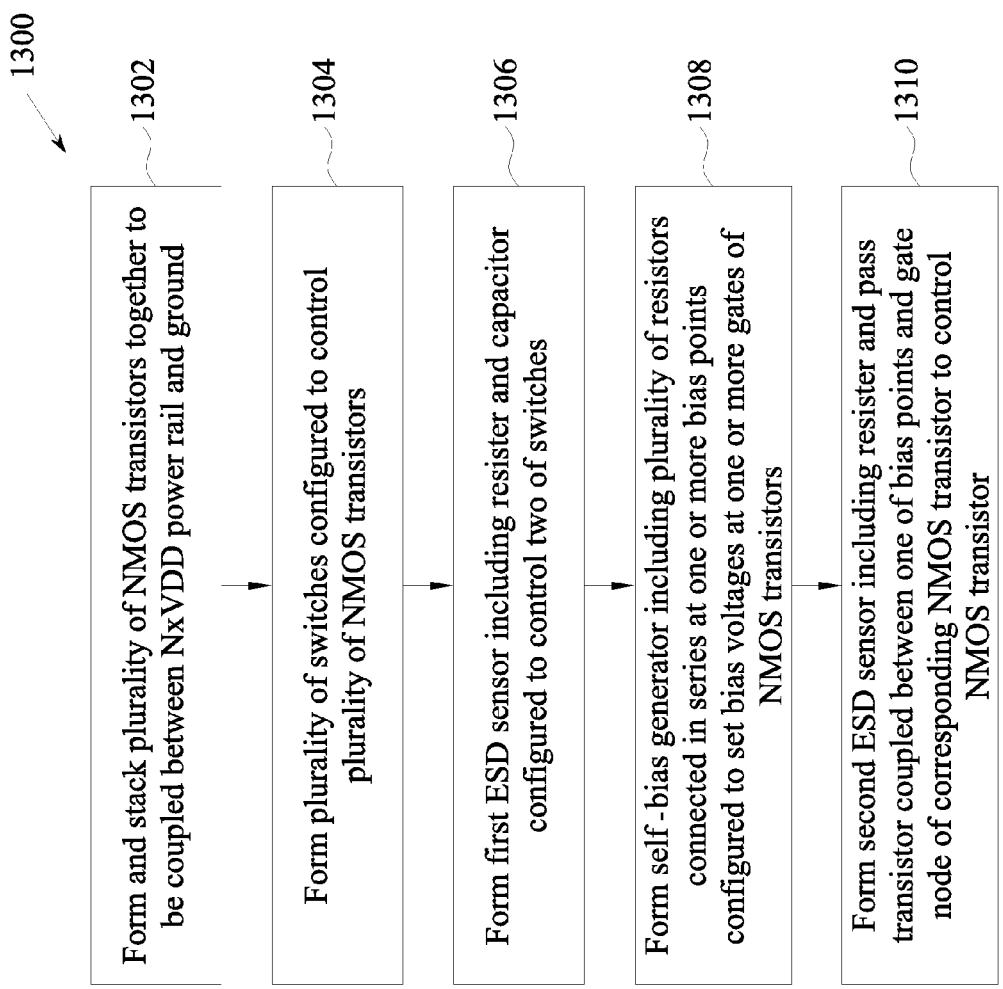
FIG. 13 is a flow chart of an example of a manufacturing process of the electro-static discharge clamp in accordance with some embodiments.

FIG. 13 is a flow chart 1300 of an example of a manufacturing process of the electro-static discharge clamp described above.

At step 1302, a plurality of NMOS transistors are formed and stacked together to be coupled between NxVDD power rail and ground.

At step 1304, a plurality of switches are formed and configured to control the plurality of NMOS transistors.

At step 1306, a first ESD sensor including a resister and a capacitor is formed and configured to control two of the switches.

At step 1308, a self-bias generator including a plurality of resistors connected in series at one or more bias points is formed and configured to set bias voltages at one or more gates of the NMOS transistors.

At step 1310, a second ESD sensor including a resister and a pass transistor is formed and coupled between one of the bias points and the gate of a corresponding NMOS transistor to control the NMOS transistor.

In some embodiments, a circuit with an electro-static discharge clamp coupled to a first power source and a second power source comprises an NMOS transistor stack, which comprises a first NMOS transistor with a first gate node and a drain connected to the first power source, and a second NMOS transistor with a second gate node, the second NMOS transistor being stacked with the first NMOS transistor and the second power source. The circuit further comprises an electro-static discharge detector configured to control the NMOS transistor stack, wherein the electro-static discharge detector further comprises a first switch configured to switch the first gate node to the first power source, a second switch configured to switch the first gate node to the second gate node, and a third switch configured to switch the second gate node to the second first power source. The circuit further comprises a first electro-static discharge sensor coupled to and configured to control the second switch and the third switch but not the first switch, and a second electro-static discharge sensor coupled to and configured to control the first NMOS transistor.

In some embodiments, a circuit with an electro-static discharge clamp coupled to a first power source and a second power source comprises an NMOS transistor stack, which comprises a plurality of first NMOS transistors with a plurality of first gate nodes and a drain connected to the first power source and a second NMOS transistor with a second gate node, the second NMOS transistor being stacked with the first NMOS transistor and the second power source. The circuit further comprises an electro-static discharge detector configured to control the NMOS transistor stack, wherein the electro-static discharge detector further comprises a plurality of switches configured to switch each of the first gate nodes and the second gate node of the NMOS transistor stack. The circuit further comprises a first electro-static discharge sensor coupled to and configured to control two of the switches but not other switches in the electro-static discharge detector, and a second electro-static discharge sensor coupled to and configured to control the plurality of first NMOS transistors.

In some embodiments, a method of manufacturing an electro-static discharge clamp to be coupled to a first power source and a second power source, comprises forming and stacking a plurality of NMOS transistors together to be coupled between a first power source and a second power source and forming a plurality of switches configured to control the plurality of NMOS transistors. The method further comprises forming a first ESD sensor including a resister and a capacitor configured to control two of the switches, and forming a second ESD sensor including a resister and a pass transistor coupled between one of the bias points and the gate node of a corresponding NMOS transistor to control the NMOS transistor.

The previous description of the embodiments is provided to enable any person skilled in the art to practice the invention. The various modifications to these embodiments will be readily apparent to those skilled in the art, and the generic principles defined herein may be applied to other embodiments without the use of inventive faculty. Thus, the current disclosure is not intended to be limited to the embodiments shown herein, but is to be accorded the widest scope consistent with the principles and novel features disclosed herein.

What is claimed is:

1. A circuit with an electro-static discharge clamp coupled to a first power source and a second power source, comprising:
    an NMOS transistor stack comprising:
        a first NMOS transistor with a first gate node and a drain connected to the first power source;
        a second NMOS transistor with a second gate node the second NMOS transistor being stacked with the first NMOS transistor and the second power source;
    an electro-static discharge detector configured to control the NMOS transistor stack, wherein the electro-static discharge detector comprising:
    a first switch configured to switch the first gate node to the first power source;
    a second switch configured to switch the first gate node to the second gate node;
    a third switch configured to switch the second gate node to the second power source;
    a first electro-static discharge sensor coupled to and configured to control the second switch and the third switch but not the first switch; and
    a second electro-static discharge sensor coupled to and configured to control the first NMOS transistor.

2. The circuit of claim 1, wherein the voltage of the first power source is greater than the voltage of the second power source.

3. The circuit of claim 1, wherein the voltage of the first power source is N times of voltage VDD during normal operation, wherein N is greater than one.

4. The circuit of claim 1, wherein the voltage of the second power source is VSS.

5. The circuit of claim 1, further comprising:
a self-bias generator coupled between the first power source and the second power source and configured to set voltage at the first gate node via the second electro-static discharge sensor.

6. The circuit of claim 5, wherein the second electro-static discharge sensor includes a resistor and a transistor coupled between the first gate node and a bias point of the self-bias generator.

7. The circuit of claim 5, wherein the self-bias generator includes a plurality of resistors connected in series at one or more bias points.

8. The circuit of claim 5, wherein the self-bias generator includes a plurality of diode strings connected in series at one or more bias points.

9. The circuit of claim 5, wherein the self-bias generator includes a plurality of MOS strings connected in series at one or more bias points.

10. The circuit of claim 1, the wherein the first switch is a capacitor.

11. The circuit of claim 1, the wherein the first switch is a diode string.

12. The circuit of claim 1, the wherein the first switch is a PMOS transistor.

13. The circuit of claim 1, wherein the second switch is a PMOS transistor.

14. The circuit of claim 1, wherein the third switch is a third NMOS transistor.

15. The circuit of claim 1, wherein the first electro-static discharge sensor is a resistance-capacitance (RC) sensor.

16. The circuit of claim 15, the wherein the capacitor is a pass transistor.

17. The circuit of claim 1, wherein the first electro-static discharge sensor is a latch circuit detector.

18. A circuit with an electro-static discharge clamp coupled to a first power source and a second power source, comprising:
    an NMOS transistor stack comprising:
        a plurality of first NMOS transistors with a plurality of first gate nodes and a drain connected to the first power source;
        a second NMOS transistor with a second gate node the second NMOS transistor being stacked with the first NMOS transistor and the second power source; and
    an electro-static discharge detector configured to control the NMOS transistor stack, wherein the electro-static discharge detector further comprising a plurality of switches configured to switch each of the first gate nodes and the second gate node of the NMOS transistor stack;
    a first electro-static discharge sensor coupled to and configured to control two of the switches but not other switches in the electro-static discharge detector; and
    a second electro-static discharge sensor coupled to and configured to control the plurality of first NMOS transistors.

19. The circuit of claim 18, further comprising:
a self-bias generator coupled between the first power source and the second power source and configured to set voltages at the first gate nodes via the second electro-static discharge sensor.

20. The circuit of claim 18, wherein:
the first electro-static discharge sensor includes a resister and a capacitor configured to control two of the switches;
the second electro-static discharge sensor includes a resister and a pass transistor coupled between one of the bias points and the gate node of a corresponding NMOS transistor to control the NMOS transistor.

* * * * *